United States Patent
Nakai et al.

(10) Patent No.: US 9,449,798 B2
(45) Date of Patent: Sep. 20, 2016

(54) PLASMA PROCESSING DEVICE, PRINTING APPARATUS, PRINTING SYSTEM, COMPUTER PROGRAM PRODUCT, AND METHOD FOR MANUFACTURING PRINTED MATERIAL

(71) Applicants: Junji Nakai, Kanagawa (JP); Hiroyoshi Matsumoto, Kanagawa (JP)

(72) Inventors: Junji Nakai, Kanagawa (JP); Hiroyoshi Matsumoto, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/639,052

(22) Filed: Mar. 4, 2015

(65) Prior Publication Data
US 2015/0251453 A1 Sep. 10, 2015

(30) Foreign Application Priority Data

Mar. 7, 2014 (JP) .................................. 2014045715
Jan. 21, 2015 (JP) .................................. 2015009712

(51) Int. Cl.
*B41J 11/00* (2006.01)
*H01J 37/32* (2006.01)

(52) U.S. Cl.
CPC ...... *H01J 37/32825* (2013.01); *B41J 11/0015* (2013.01); *H01J 37/3299* (2013.01); *H01J 37/32935* (2013.01)

(58) Field of Classification Search
CPC ........ B41J 2/01; B41J 11/0015; B41J 11/002
See application file for complete search history.

(56) References Cited

U.S. PATENT DOCUMENTS

| | | | |
|---|---|---|---|
| 8,186,823 B2 | 5/2012 | Saitoh et al. | |
| 2005/0129859 A1* | 6/2005 | Misev et al. | 427/384 |
| 2006/0209118 A1* | 9/2006 | Nakajima | 347/22 |
| 2007/0058019 A1 | 3/2007 | Saitoh et al. | |
| 2009/0207224 A1* | 8/2009 | Cofler | 347/102 |
| 2009/0290007 A1* | 11/2009 | Saitoh et al. | 347/102 |
| 2011/0064489 A1 | 3/2011 | Bisaiji et al. | |
| 2013/0250017 A1* | 9/2013 | Saitoh et al. | 347/101 |
| 2014/0002560 A1* | 1/2014 | Ohkawa et al. | 347/102 |
| 2014/0078212 A1 | 3/2014 | Nakai et al. | |
| 2014/0160197 A1 | 6/2014 | Hirose et al. | |
| 2015/0035918 A1 | 2/2015 | Matsumoto et al. | |
| 2015/0202894 A1* | 7/2015 | Kitada | B41J 11/002 347/102 |

FOREIGN PATENT DOCUMENTS

| | | |
|---|---|---|
| JP | 2000-117958 | 4/2000 |
| JP | 2009-279796 | 12/2009 |
| JP | 2010-188568 | 9/2010 |
| JP | 4662590 | 1/2011 |
| JP | 2013-006308 | 1/2013 |
| JP | 2013178922 A * | 9/2013 |

* cited by examiner

*Primary Examiner* — Kristal Feggins
*Assistant Examiner* — Kendrick Liu
(74) *Attorney, Agent, or Firm* — Duft Bornsen & Fetting LLP

(57) ABSTRACT

A plasma processing device includes a plasma processing unit that performs plasma processing on a predetermined area on a target recording medium at least two times; and a control unit that sets a plasma energy amount used by the plasma processing unit to perform a first plasma processing on the predetermined area of the target recording medium as a first energy amount and sets a plasma energy amount used by the plasma processing unit to perform a second plasma processing on the predetermined area as a second energy amount smaller than the first energy amount.

17 Claims, 12 Drawing Sheets

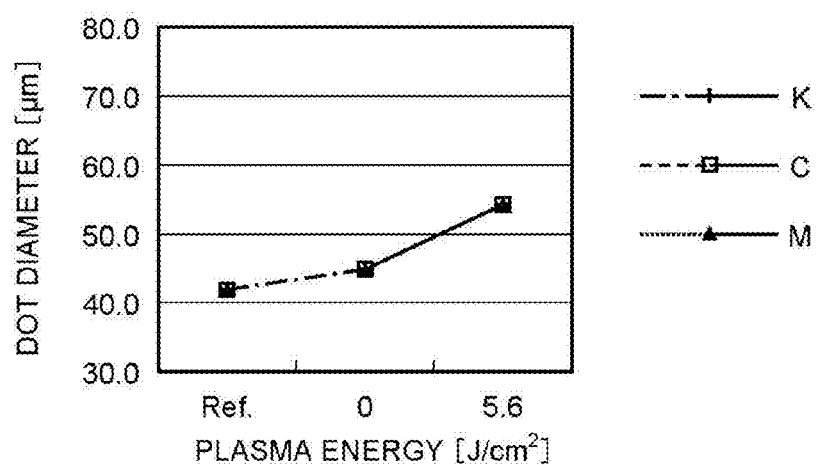

PLASMA PROCESSING DEVICE, PRINTING APPARATUS, PRINTING SYSTEM, COMPUTER PROGRAM PRODUCT, AND METHOD FOR MANUFACTURING PRINTED MATERIAL

CROSS-REFERENCE TO RELATED APPLICATIONS

The present application claims priority to and incorporates by reference the entire contents of Japanese Patent Application No. 2014-045715 filed in Japan on Mar. 7, 2014 and Japanese Patent Application No. 2015-009712 filed in Japan on Jan. 21, 2015.

BACKGROUND OF THE INVENTION

1. Field of the Invention

The present invention relates to a plasma processing device, a printing apparatus, a printing system, a computer program product, and a method for manufacturing a printed material.

2. Description of the Related Art

Generally, non-permeable media or slow-permeable media such as acrylic, polyester, or vinyl chloride film, and coat paper are inferior to plain paper in wettability and drying property. In printing on such media, landed ink does not promptly permeate into the media, resulting in the occurrences of irregular bonding of dots (beading) and mixing of colors (bleeding) between adjacent dots. As a result, image quality deteriorates in some cases.

Examples of the techniques that solve such a problem include a multipath printing method in which printing is performed by reducing an amount of ink per ejection and by overlapping a small amount of the ink several times on multiple paths (multipath), and a method that uses an additional drying device for drying ink dots. Conventional techniques are described in Japanese Patent No. 4662590 and Japanese Patent Application Laid-open No. 2010-188568.

The multipath printing technique has, however, a problem in that abnormal images easily occur due to banding (density unevenness) occurring in a scanning pitch (band width) in the printing. This problem cannot be solved even when plasma processing is performed on the media as pretreatment.

In view of the above situations, there is a need to provide a plasma processing device, a printing apparatus, a printing system, a computer program product, and a method for manufacturing a printed material that can prevent the occurrence of the banding in the multipath printing and manufacture high quality printed materials.

SUMMARY OF THE INVENTION

It is an object of the present invention to at least partially solve the problems in the conventional technology.

According to an embodiment, there is provided a plasma processing device comprising a plasma processing unit that performs plasma processing on a predetermined area on a target recording medium at least two times; and a control unit that sets a plasma energy amount used by the plasma processing unit to perform a first plasma processing on the predetermined area of the target recording medium as a first energy amount and sets a plasma energy amount used by the plasma processing unit to perform a second plasma processing on the predetermined area as a second energy amount smaller than the first energy amount.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 19 is a graph illustrating diameters of dots formed after ink droplets having the same diameter according to the embodiment were dropped on a surface of tarpaulin, which is a non-permeable medium;

FIG. 20 is the images of the ink dots actually formed on the surface of the non-permeable medium (white vinyl chloride sheet) when the ink droplets having the same size according to the embodiment were dropped on the medium;

DETAILED DESCRIPTION OF THE PREFERRED EMBODIMENT

The following describes an embodiment in detail with reference to the accompanying drawings. The embodiment described below is a preferred specific example of the invention and technically preferred various limitations are applied. The scope of the invention is, however, not limited to the embodiment by the following description. All of the structures described in the embodiment are not indispensable to the invention.

In the following embodiment, plasma processing is performed on a surface of a processing object such as a recording medium or a printing medium (hereinafter, simply described as a medium or a target recording medium) so as to prevent pigments in ink from being scattered and cause the pigments to be aggregated immediately after the landing of the ink on the medium. The plasma processing causes permeability of the medium and wettability of a surface of the medium to be increased, resulting in the landed dots being promptly spread. As a result, the ink on the surface of the medium can be promptly dried.

As a result of the plasma processing performed on the medium, an organic substance on the surface is oxidized by produced active species such as oxygen radicals and ozone, thereby producing hydrophilic and acidic functional groups. Performing the plasma processing can thus also control the pH value of (acidify) the surface of the medium.

As described above, the use of the plasma processing can increase circularity of ink dots (hereinafter, simply described as dots) by controlling the aggregation and permeability of pigments of ink, and increase sharpness and expand the color gamut of the dots by preventing the dots from being gathered to one another. As a result, image defects such as beading and bleeding are solved, thereby making it possible to produce printed materials on which high quality images are formed. In addition, an ink droplet amount can be reduced by uniformly thinning the thickness of pigment aggregation on the medium, thereby making it possible to reduce energy for drying ink and a printing cost.

Figure 1:
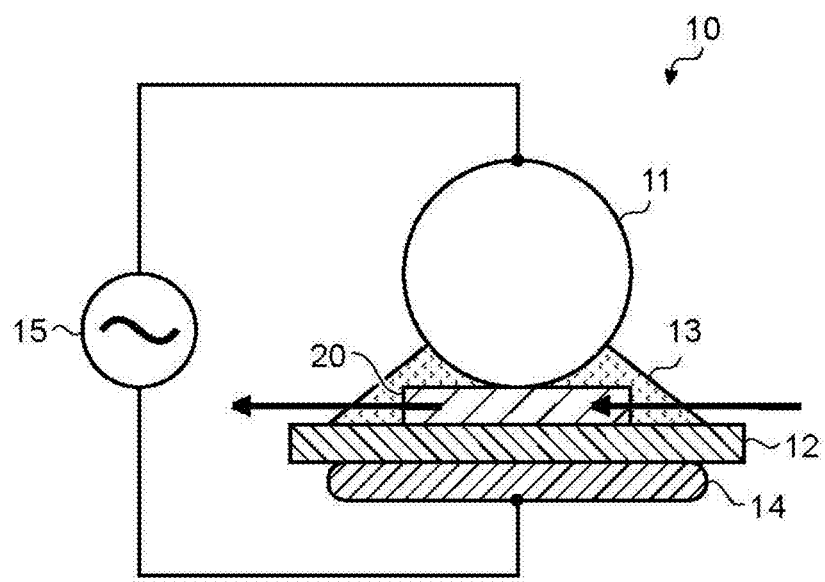
FIG. 1 is a schematic diagram illustrating an example of a plasma processing device according to an embodiment.

FIG. 1 is a schematic diagram for explaining an outline of the plasma processing employed in the embodiment. As illustrated in FIG. 1, a plasma processing device 10 is used in the plasma processing employed in the embodiment. The plasma processing device 10 includes a discharge electrode 11, a counter electrode 14, a dielectric 12, and a high frequency high voltage power source 15. The dielectric 12 is disposed between the discharge electrode 11 and the counter electrode (a grounding electrode) 14. The discharge electrode 11 and the counter electrode 14 may have a portion where metal is exposed or may be covered with a dielectric material such as insulating rubber or ceramics or an insulating material. The dielectric 12 disposed between the discharge electrode 11 and the counter electrode 14 may be an insulating material such as polyimide, silicon, or ceramics. When corona discharge is used as the plasma processing, the dielectric 12 may be omitted. The dielectric 12 is preferably provided in some cases such as a case where dielectric-barrier discharge is used. In such a case, the dielectric 12 is disposed such that the dielectric 12 is adjacent to or comes into contact with the counter electrode 14 rather than the discharge electrode 11 so as to increase an area of creeping discharge, thereby making it possible to enhance the effect of the plasma processing. The discharge electrode 11 and the counter electrode 14 (or the electrode on a side adjacent to the dielectric 12, i.e., the dielectric 12) may be disposed at positions where they come or do not come into contact with a medium (processing object) 20 that passes between the two electrodes.

The high frequency high voltage power source 15 applies a high frequency high voltage pulse voltage between the discharge electrode 11 and the counter electrode 14. The voltage value of the pulse voltage is about 10 kilo volts (kV) (peak to peak), for example. The frequency is about 20 kilo hertz (kHz), for example. The supply of such a high frequency high voltage pulse voltage between the two electrodes causes an atmospheric non-equilibrium plasma 13 to be generated between the discharge electrode 11 and the dielectric 12. The medium 20 passes between the discharge electrode 11 and the dielectric 12 while the atmospheric non-equilibrium plasma 13 is generated. As a result, the surface on the discharge electrode 11 side of the medium 20 is subjected to the plasma processing.

In the plasma processing using the plasma processing device 10 illustrated in FIG. 1, the medium 20 is irradiated with plasma in the atmosphere, thereby causing polymers on the surface of the medium 20 to be reacted and hydrophilic active functional groups to be produced. Specifically, electrons e emitted from the discharge electrode are accelerated in an electric field, and excite and ionize atoms and molecules in the atmosphere. Electrons are also emitted from the ionized atoms and molecules, thereby increasing high-energy electrons. As a result, streamer discharge (plasma) is generated. The high-energy electrons produced by the streamer discharge cut polymeric bonds on the surface of the medium (e.g., coat paper) and the cut polymer pieces are bonded again to oxygen radicals O*, hydroxyl radicals (*OH), or ozone ($O_3$) in a gas phase. The coat layer of coat paper includes calcium carbonate and starch that serves as a binder and has a polymer conformation having the polymeric bonds. The processing described above is called the plasma processing. As a result of the plasma processing, polar functional groups such as hydroxyl groups and carboxyl groups are produced on the surface of a printing medium. Consequently, hydrophilicity and acidity are imparted on the surface of the printing medium. An increase in carboxyl groups causes the surface of the printing medium to be acidified (the pH value thereof to be reduced).

The increase in hydrophilicity of the surface of the printing medium causes the dots adjacent to one another on the surface of the printing medium to wet and spread on the surface, resulting in the dots being gathered to one another. To prevent the occurrence of mixing of colors among the dots due to the gathering, it is necessary to cause colorants (e.g., pigments and dye particles) to be aggregated promptly in the dots, vehicle to be dried before the vehicle wets and spreads, or the vehicle to be permeated into the printing medium. The plasma processing exemplarily described above also acts as acidifying means (process) that acidifies the surface of the printing medium, thereby making it possible to increase a rate of aggregation of the colorants in the dots. Also from this point of view, it is effective to perform the plasma processing as the pretreatment of inkjet recording.

The plasma processing performed by the plasma processing device 10 may be atmospheric non-equilibrium plasma processing using dielectric-barrier discharge, for example. The plasma processing using the atmospheric non-equilibrium plasma is one of the preferable plasma processing methods on the medium because an electron temperature in the plasma is extremely high and a gas temperature in the plasma is around a normal temperature.

To stably generate the atmospheric non-equilibrium plasma in a wide area, it is preferable to perform the atmospheric non-equilibrium plasma employing the dielectric-barrier discharge in the form of a streamer breakdown. The dielectric-barrier discharge in the form of a streamer breakdown can be achieved by applying an alternating high voltage between electrodes covered with a dielectric material, for example.

However, various methods can be used for generating the atmospheric non-equilibrium plasma besides the dielectric-barrier discharge with streamer breakdown. For example, dielectric-barrier discharge using an insulation material such as a dielectric material interposed between the electrodes, corona discharge that forms an extreme non-uniform electric field on a thin metal wire or the like, and pulse discharge using an applied short pulse voltage can be used. Two or more of those methods can be combined. The plasma processing is performed in the atmosphere in the embodiment. The plasma processing is not limited to being performed in the atmosphere. The plasma processing may be performed in a gas atmosphere such as a nitrogen or oxygen gas atmosphere.

The plasma processing device 10 exemplarily illustrated in FIG. 1 employs the discharge electrode 11 that can rotate so as to send the medium 20 in the conveying direction. The structure is, however, not limited to this example. For example, one or more discharge electrodes that can move in a direction (scanning direction) perpendicular to the conveying direction of the medium 20 may be employed. Such electrodes are exemplarily described later.

The following describes the plasma processing device, a printing apparatus, a printing system, a computer program product, and a method for manufacturing a printed material in detail according to the embodiment with reference to the accompanying drawings.

In the embodiment, an image forming apparatus is described that includes ejecting heads (recording heads or ink heads) for respective four colors of black (K), cyan (C), magenta (M), and yellow (Y). The ejecting heads are not limited to those examples. For example, the ejecting heads for green (G), red (R), and other colors may be further included, or only the ejecting head for black (K) may be included. In the following description, K, C, M, and Y correspond to black, cyan, magenta, and yellow, respectively.

In the embodiment, continuous paper wound in a roll shape (hereinafter described as roll paper) is used as the medium 20. The medium 20 is, however, not limited to this example. For example, any medium on which images can be formed, such as cut paper, may be used. For another example, a sheet for overhead projector (OHP), synthetic resin film, metallic thin film, and any material with a surface on which images can be formed with ink can be used as the medium 20. Examples of paper that can be used as the medium 20 include plain paper, woodfree paper, recycled paper, thin paper, thick paper, and coat paper. When non-permeable paper or slow-permeable paper such as coat paper is used as the medium 20, the embodiment described below can further demonstrate the effect. The roll paper may be continuous paper (continuous form paper or fanfold paper) provided, at certain intervals, with perforations enabling the paper to be cut into. In this case, a page in the roll paper can be defined as an area between the perforations provided at the certain intervals, for example.

Figure 2:
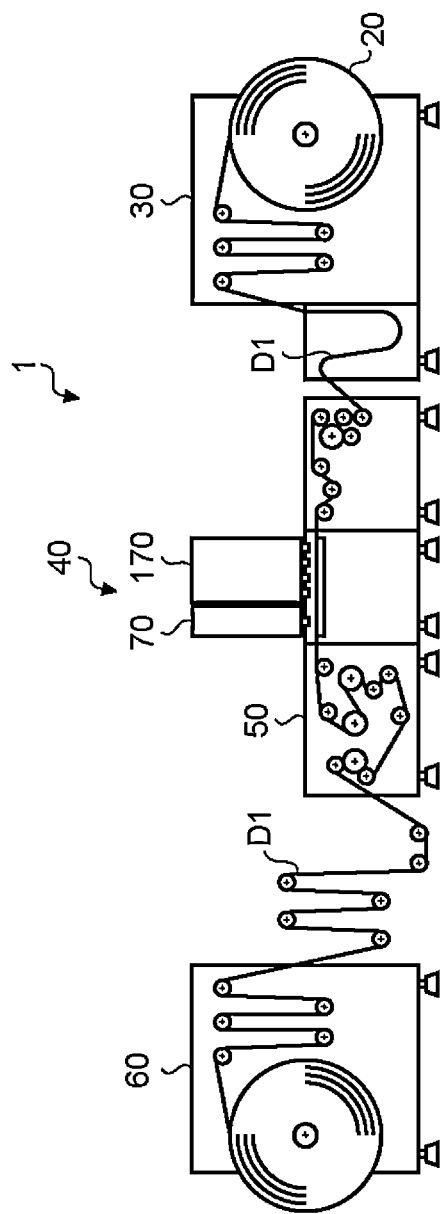
FIG. 2 is a schematic diagram illustrating an overall structure of a printing apparatus (system) according to the embodiment.

FIG. 2 is a schematic diagram illustrating an overall structure of the printing apparatus (system) according to the embodiment. As illustrated in FIG. 2, a printing apparatus (system) 1 includes a carrying-in unit 30 that carries in the medium 20 (roll paper) along a conveyance path D1 and an image forming apparatus 40 that forms an image on the surface of the medium 20 having been subjected to the plasma processing. The image forming apparatus 40 includes an inkjet recording device 170 that forms an image, by inkjet processing, on the medium 20 having been subjected to the plasma processing. The inkjet recording device 170 includes a plasma processing device that performs the plasma processing on the surface of the medium 20. The image forming apparatus 40 may further include a post-processing unit 70 that performs post-processing on the medium 20 on which an image has been formed. Those devices may be included in the system as components with respective housings or included in the same housing to structure the printing apparatus. When those devices are structured as the printing system, a control unit that controls the whole or a part of the system may be included in any of the devices or in another independent housing.

The printing apparatus (system) 1 may include a drying unit 50 that dries the medium 20 after printing and a carrying-out unit 60 that carries out the medium 20 on which an image has been formed (and the post-processing has been performed in some cases). The printing apparatus (system) 1 may further include, as a pretreatment unit that performs pretreatment on the medium 20, a pre-applying unit (not illustrated) that applies a processing liquid called a pre-applying solution containing a polymer material on the surface of the medium 20 besides the plasma processing device.

The printing apparatus (system) 1 further includes a control unit (not illustrated) that controls operation of the units. The control unit may be connected to a printing control device that produces raster data from image data of an object to be printed, for example. The printing control device may be provided in the printing apparatus (system) 1 or provided externally by being connected through a network such as the Internet or a local area network (LAN).

Figure 3:
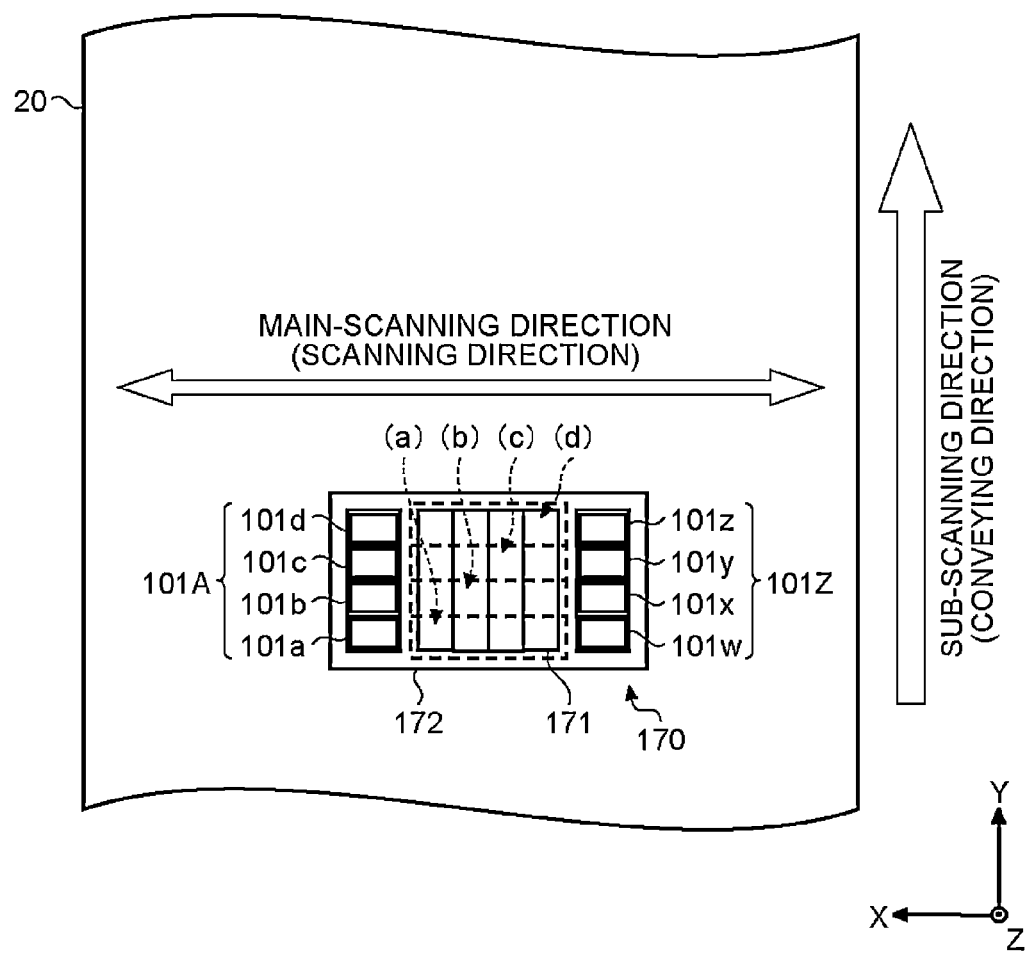
FIG. 3 is a top view illustrating an overall head structure of an inkjet recording device.
Figure 4:
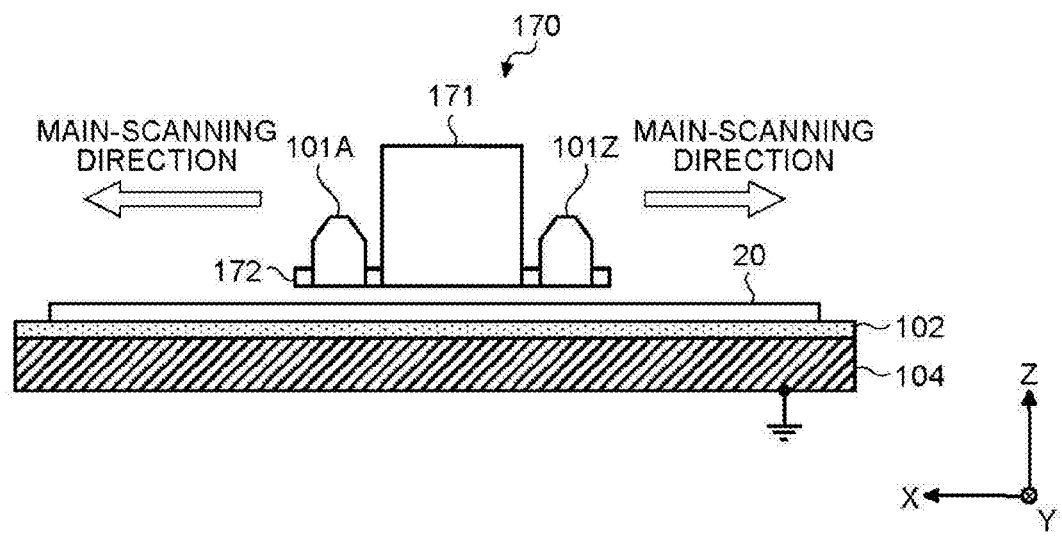
FIG. 4 is a side view illustrating the overall head structure along a scanning direction.
Figure 5:
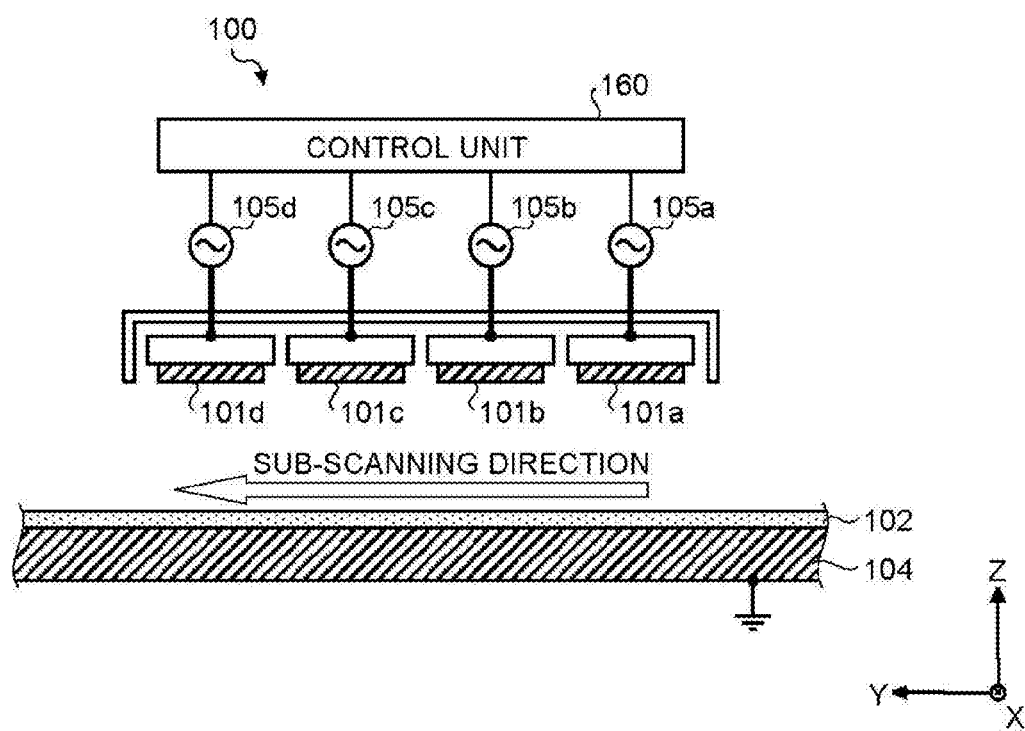
FIG. 5 is a schematic diagram illustrating an overall structure of the plasma processing device mounted on the inkjet recording device.

The following describes the overall structure of the inkjet recording device 170 of the printing apparatus (system) 1 illustrated in FIG. 2 with reference to FIGS. 3 to 5 as selected diagrams. FIG. 3 is a top view illustrating an overall head structure of the inkjet recording device. FIG. 4 is a side view illustrating the overall head structure along a scanning direction. FIG. 5 is a schematic diagram illustrating the overall structure of the plasma processing device mounted on the inkjet recording device.

As illustrated in FIGS. 3 and 4, the inkjet recording device 170 includes an inkjet head 171, a plurality of discharge electrodes 101a to 101d and 101w to 101z, and a carriage 172 provided with the inkjet head 171 and the discharge electrodes 101a to 101d and 101w to 101z. The carriage 172 can be transferred by a transfer mechanism (not illustrated) in a reciprocating manner in a direction (described as the scanning direction or a main-scanning direction) perpendicular to the conveying direction (a sub-scanning direction) of the medium 20. The inkjet head 171 ejects ink dots while being transferred by the carriage 172 in the scanning direction so as to perform printing on the surface of the medium 20. The discharge electrodes 101a to 101d and 101w to 101z perform discharging while being transferred by the carriage 172 in the scanning direction so as to perform the plasma processing on the surface of the medium 20.

More specifically, the inkjet head 171 includes a plurality of heads each having the same color (e.g., four heads of respective four colors) for increasing a printing speed, for example. In the example of the inkjet head 171 illustrated in FIG. 3, four heads for the respective four colors are arranged in the main-scanning direction. Each head includes a plurality of arranged nozzles. The nozzles included in each of the heads for the respective colors are divided into four groups arranged in the sub-scanning direction (hereinafter described as the nozzle groups). Thus, the nozzle groups of the respective four colors are arranged in each row in the main-scanning direction. The inkjet head 171 exemplarily illustrated in FIG. 3 includes the nozzle groups (a) to (d). In the following description, a belt-like area on which printing is performed by each of the nozzle groups (a) to (d) with one-time scan or an image printed on the belt-like area is described as a band.

The nozzles included in the respective nozzle groups (a) to (d) are fixed in a shifted manner such that the distances between the nozzles are corrected to achieve high speed image forming with high resolution (e.g., 1200 dpi). The inkjet head 171 can be driven by a plurality of types of drive frequencies for ink dots (droplets) that are ejected from the respective nozzles and have three types of volumes, which are called a big droplet, a medium droplet, and a small droplet. The drive frequencies are input to the inkjet head 171 from a drive circuit (not illustrated) connected to a control device (not illustrated).

The discharge electrodes 101a to 101d and 101w to 101z are mounted on both sides of the inkjet head 171 on the carriage 172 such that the inkjet head 171 is interposed between the discharge electrodes 101a to 101d and 101w to 101z in the scanning direction, for example. In FIGS. 3 and 4, the discharge electrodes arranged on one side (defined as the right side) of the inkjet head 171 are the discharge electrodes 101a to 101d (collectively described as a discharge electrode 101A) while the discharge electrodes arranged on the other side (defined as the left side) of the inkjet head 171 are the discharge electrodes 101w to 101z (collectively described as a discharge electrode 101Z).

The electrode length of each of the discharge electrodes 101a to 101d and 101w to 101z coincides with the length in the sub-scanning direction of each of the nozzle groups (a) to (d) of the inkjet head 171 (hereinafter described as the band width). For example, in a multi-scan head for four scans, the band width is one fourth of the whole length in the sub-scanning direction of the inkjet head 171. In this case, the length along the sub-scanning direction of each of the discharge electrodes 101a to 101d and 101w to 101z is also set to one fourth of the whole length of the inkjet head 171 in the same manner as the bandwidth.

As illustrated in FIG. 5, a plasma processing device 100 provided with the discharge electrodes 101a to 101d and 101w to 101z includes high frequency high voltage power sources 105a to 105d and 105w to 105z (the high frequency high voltage power sources 105w to 105z are omitted to be illustrated) provided to the discharge electrodes 101a to 101d and 101w to 101z, respectively, a dielectric 102 and a counter electrode 104 that are arranged such that they face the whole transferring area of the discharge electrodes 101a to 101d and 101w to 101z, and a control unit 160 that controls the high frequency high voltage power sources 105a to 105d and 105w to 105z. The dielectric 102 is disposed on a side adjacent to the counter electrode 104 between the counter electrode 104 and the discharge electrodes 101a to 101d and 101w to 101z, for example. The dielectric 102 is not limited to being disposed as exemplified above. The dielectric 102 may be disposed on a side adjacent to the discharge electrodes 101a to 101d and 101w to 101z. In this case, the dielectric 102 may be divided into a plurality of pieces in accordance with the arrangement of the discharge electrodes 101a to 101d and 101w to 101z.

The dielectric 102 and the counter electrode 104 illustrated in FIG. 5 may each have a size that covers the whole of the transferring range of the discharge electrodes 101a to 101d and 101w to 101z, for example. A gap that allows the medium 20 to pass through therein is provided between the counter electrode 104 and the discharge electrodes 101a to 101d and 101w to 101z. The distance of the gap may allow the medium 20 to pass through therein while or without coming into contact with the discharge electrodes 101a to 101d and 101w to 101z.

The high frequency high voltage power sources 105a to 105d and 105w to 105z supply a pulse voltage of about 10 kV (peak to peak) with a frequency of about 20 kHz between the counter electrode 104 and the discharge electrodes 101a to 101d and 105w to 105z in accordance with the control of the control unit 160, thereby causing the atmospheric non-equilibrium plasma to be generated on the conveyance path of the medium 20. The plasma energy amount in this case can be obtained from the voltage value and the applying time of the high frequency high voltage pulse supplied to each of the discharge electrodes 101a to 101d and 101w to 101z and the current flowing in the medium 20. The plasma energy amount in one time plasma processing may be calculated or controlled as the amount of energy of the whole of the discharge electrodes but not for each of the discharge electrodes 101a to 101d and 101w to 101z.

The control unit 160 can individually turn on or off the high frequency high voltage power sources 105a to 105d and 105w to 105z. For example, the control unit 160 may adjust the plasma energy amount supplied to the medium 20 by selectively driving a specified number of the high frequency high voltage power sources 105a to 105d and 105w to 105z, the number being proportional to printing speed information input from a higher level device. When the necessary plasma energy amount differs by types of media, the control unit 160 may adjust the plasma energy amount by selectively driving a specified number of the high frequency high voltage power sources 105a to 105d and 105w to 105z, the number corresponding to the type of medium.

In the embodiment, the nozzle groups (a) to (d) correspond to the respective discharge electrodes 101a to 101d or 101w to 101z on one-to-one basis. Specifically, the plasma processing is performed on the band that is the printing target area of a certain nozzle group (e.g., the nozzle group (a)) by the discharge electrode (e.g., the discharge electrode 101a or 101w) that corresponds to the nozzle group. In such a case, the plasma processing and the printing are performed by one-time scan, thereby making it possible to efficiently perform the printing.

As an image forming method using the inkjet head 171 having a plurality of nozzles arranged in the main-scanning direction, an overlap recording method can be adopted. The overlap recording method is a recording method in which an image corresponding to one main-scanning line is completed by performing printing on the main-scanning line a plurality of times using different nozzles. As for the image forming method using the inkjet head 171, a multipath technique can also be adopted in which an image is formed by repeating the scan in the main-scanning direction using the nozzles corresponding to a plurality of paths.

Figure 6:
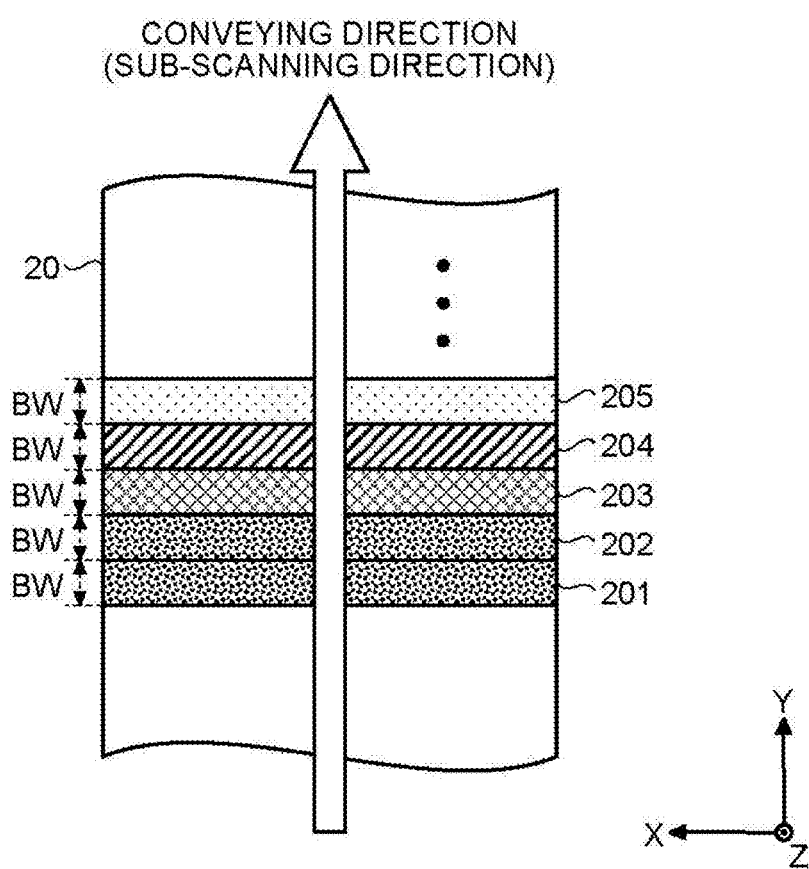
FIG. 6 is a top view illustrating a print after the printing with five scans by a multipath technique.

The following describes the image forming method using the multipath method. FIG. 6 is a top view illustrating a print after the printing with five scans by the multipath method. FIG. 7(a) to (e) are side views illustrating a cross-sectional structure of the print illustrated in FIG. 6. In the prints illustrated in FIGS. 6 and 7, the number of paths in the sub-scanning direction is four for easy understanding.

The nozzle groups (not illustrated) of the inkjet head 171 correspond to four divided groups of a first path row to a fourth path row (nozzle groups (a) to (d)). The nozzles arranged in each path are used for printing a corresponding path. The printed area formed by one-time scan is a belt-like band having a band width BW. From the first scan to the third scan, the nozzle groups are sequentially started to be driven from the nozzle group corresponding to the first path row using a printing start position in the sub-scanning direction as a reference position. From the fourth scan to the (N−3)th scan (the Nth scan is the last scan), all of the four path rows are printed by one-time scan. From the fourth scan to the (N−3)th scan, thus, four paths are printed by one-time scan. From the (N−2)th scan to the Nth scan, the nozzle groups are sequentially stopped to be driven from the nozzle group corresponding to the first path row using a printing stop position in the sub-scanning direction as a reference position in an opposite manner as that from the first scan to the third scan. On the band after being subjected to four-time scans, a completed image is formed.

Figure 7:
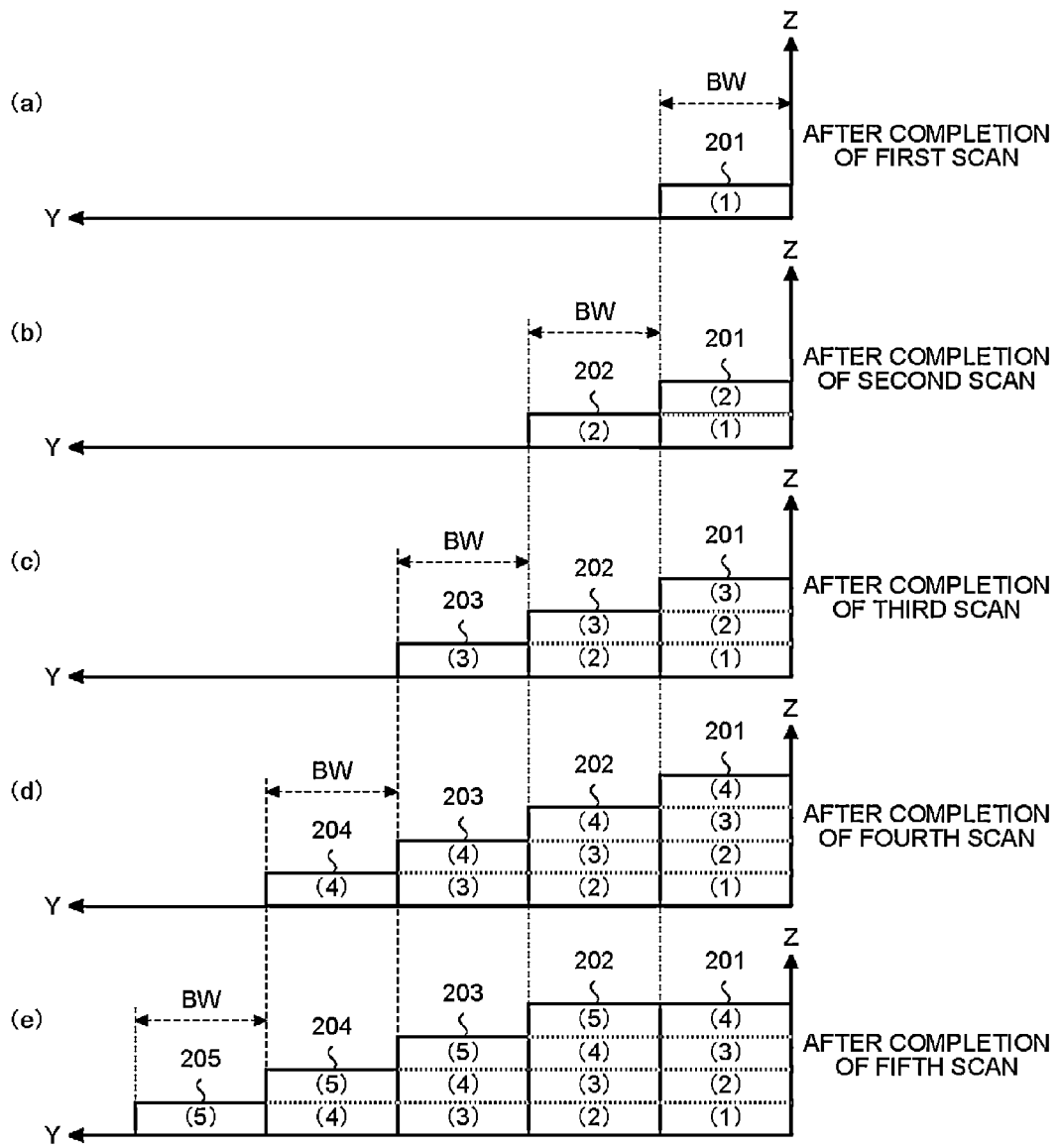
FIG. 7 is a side view illustrating a cross-sectional structure of the print illustrated in FIG. 6.

Specifically, as exemplarily illustrated in FIGS. 6 and 7, after the completion of the first scan, an image (1) is formed by the first scan on a band 201 that corresponds to the printing start position in the sub-scanning direction. Then, the scan position of the inkjet head 171 is moved in the sub-scanning direction by the band width BW with respect to the medium 20 due to the movement of the inkjet head 171 or the medium in the sub-scanning direction. Thereafter, an image (2) is formed on the band 201 and a band 202 by the second scan. In the same manner as described above, the scan position of the inkjet head 171 is moved in the sub-scanning direction by the band width BW with respect to the medium 20 for each scan. As a result, images from an image (3) onwards are overlapped on each of bands 203 to 205. Four images are overlapped by four-time scans. As a result, an image is completed on the band. For example, as illustrated in FIGS. 6 and 7, images of the bands 201 and 202 are completed after the completion of the fifth scan.

In the printing method described above, the paths are switched on the same line. As a result, the edges of the bands are on the same line. The following describes a mechanism of the occurrence of banding. FIGS. 8 to 11 are schematic diagrams that explain the mechanism of the occurrence of the banding and illustrate changes in an ink droplet after the ink droplet is landed.

Generally, in the multipath method, ink is applied in an overlapping manner with a pitch (the width obtained by dividing a writing width by the number of paths) of the specific band width BW. In the process, the pigments gather at a place where ink is easily dried due to characteristics of the ink. When the ink is dried in the state described above, a phenomenon of an increase in density at the band edge occurs. Such a phenomenon is generally called a coffee stain phenomenon (a phenomenon in which a dark color stain remains around a droplet of coffee when a coffee droplet is spilled).

Figure 8:
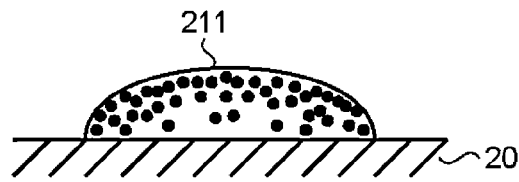
FIG. 8 is a schematic diagram illustrating an example of a distribution of pigments in an ink droplet landed on a medium.
Figure 9:
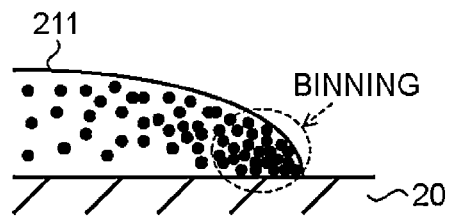
FIG. 9 is a schematic diagram illustrating an example of binning occurring in the ink droplet landed on the medium.
Figure 10:
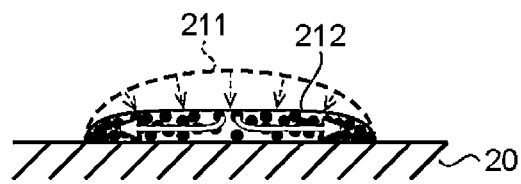
FIG. 10 is a schematic diagram illustrating an example of a state of the ink droplet landed on the medium after the ink droplet is dried.
Figure 11:
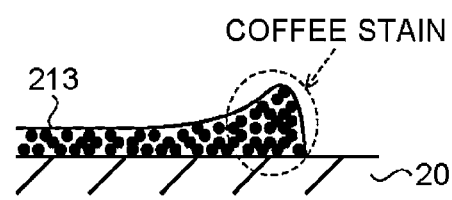
FIG. 11 is a schematic diagram illustrating an example of a coffee stain occurring in the ink droplet landed on the medium.

Specifically, as illustrated in FIG. 8, in an ink droplet 211 landed on the medium 20, the pigments gather at the surface of the droplet, thereby causing the pigments to be unevenly distributed. Normally, the fringe of the landed ink droplet 211 is dried faster than the central raised portion thereof. Thus, as illustrated in FIG. 9, thickening of the fringe occurs first, thereby causing the occurrence of the binning in which the pigments gather at the fringe. Thereafter, as illustrated in FIG. 10, as the drying of the whole of the ink droplet 211 progresses, the height of a central portion 212 is reduced while the height of the fringe at which the pigments gather is maintained, thereby causing the pigments in the central portion 212 to further gather at the fringe. As a result, as illustrated in FIG. 11, a portion having a high density of pigments, that is, a dark color raised portion (coffee stain), is formed in the fringe of the ink droplet 213. When such a coffee stain phenomenon occurs in the belt-like band, a stripe pattern (banding) occurs on the boundary of the band.

In view of such a problem, the printing apparatus (system) 1 according to the embodiment includes the plasma processing device that is used for performing the plasma processing on the medium. The plasma processing device may be mounted on the inkjet recording device 170 as illustrated in FIGS. 2 to 5 or disposed on the conveyance path D1 of the medium 20 as a unit separated from the inkjet recording device 170. As a result of the plasma processing performed on the medium, hydrophilic functional groups such as a CO group, an OH group, and a COOH group are produced on the surface of the medium, the amounts of the functional groups being according to the plasma energy amount. The hydrophilic functional groups produced on the surface of the medium cause the pH value and the surface energy of the surface of the medium to be increased and the wettability with respect to ink to be enhanced. As a result, a permeation speed of an ink droplet with respect to the medium is increased and thus the rate of aggregation of pigments is increased. Consequently, an increase in pigment density in the fringe due to the transfer of the pigments to the fringe of the band, that is, the banding, can be prevented.

The reason why the rate of aggregation of pigments is increased by the plasma processing is that the ink used has alkalinity and the pigments are uniformly dispersed in an ink liquid as dispersion elements. The surface of the medium 20 having been subjected to the plasma processing has acidity due to the produced polar functional groups (CO group, OH group, and COOH group). The alkalinity of the ink is neutralized by the acidity of the surface of the medium 20, thereby causing the pigments to be easily aggregated. As a result, the pigments are uniformly aggregated and settled out. Consequently, the density of the pigments becomes uniform without unevenness in density. The operation described above improves the density unevenness due to the coffee stain phenomenon.

Figure 12:
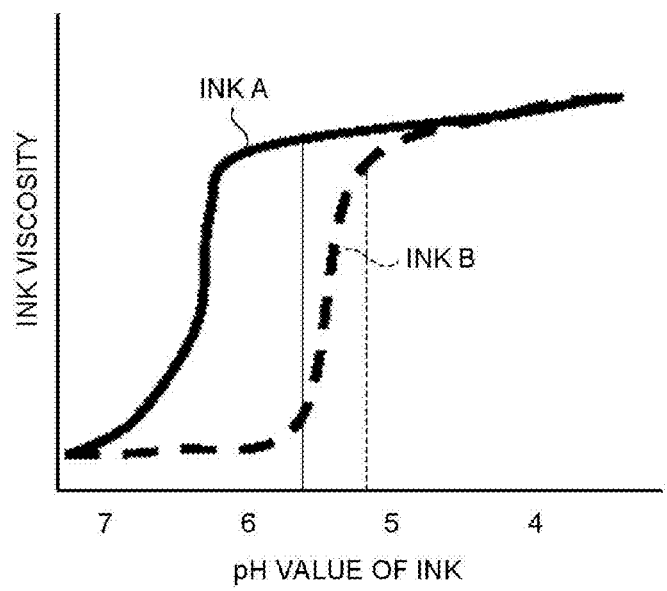
FIG. 12 is a schematic diagram illustrating an example of a relation between pH values and viscosity of ink.

The acidification in the description means that the pH value of the surface of the medium is reduced to the pH value at which the pigments contained in ink are aggregated. The reduction of a pH value means that the density of hydrogen ion $H^+$ in a substance is increased. The pigments in ink before landed on the surface of the medium are charged negatively and dispersed in a liquid such as vehicle. FIG. 12 illustrates an example of a relation between pH values and viscosity of ink. As illustrated in FIG. 12, the viscosity of the ink increases with a smaller pH value. This increase is because the pigments charged negatively in the vehicle of the ink are increasingly electrically neutralized with an increase in acidity of the ink. As a result, the pigments are aggregated. Thus, the viscosity of the ink can be increased by reducing the pH value of the surface of the medium to a value that causes the pH value of the ink to be the value corresponding to the necessary viscosity in the graph illustrated in FIG. 12, for example. The viscosity increases because when the ink is landed on the acid surface of the medium, the pigments are electrically neutralized by hydrogen ions $H^+$ on the surface of the medium, resulting in the pigments being aggregated. As a result, the mixing of colors between adjacent dots can be prevented and the pigments can be prevented from being permeated deeply into the medium (further to reach the back surface). In order to reduce the pH value of the ink to the pH value corresponding to the necessary viscosity, it is necessary to reduce the pH value of the surface of the medium to a smaller value than the pH value of the ink corresponding to the necessary viscosity.

The pH value corresponding to the necessary viscosity of ink differs by the characteristics of the ink. As illustrated in FIG. 12, the pigments of an ink A are aggregated at a pH value relatively close to neutrality, thereby increasing the viscosity, while the pigments of an ink B having a different characteristic from that of the ink A are aggregated at a pH value smaller than that at which the pigments of the ink A are aggregated.

The behavior of colorant aggregation in the dot, the drying speed of the vehicle, and the permeation speed of the vehicle in the medium differ by a droplet amount changed by the dot size (the small droplet, the medium droplet, or the large droplet) and the type of medium. As described below, the plasma energy amount in the plasma processing may be controlled to an optimum value in accordance with the types of the processing object (media) and printing modes (droplet amounts), in the embodiment.

Figure 13:
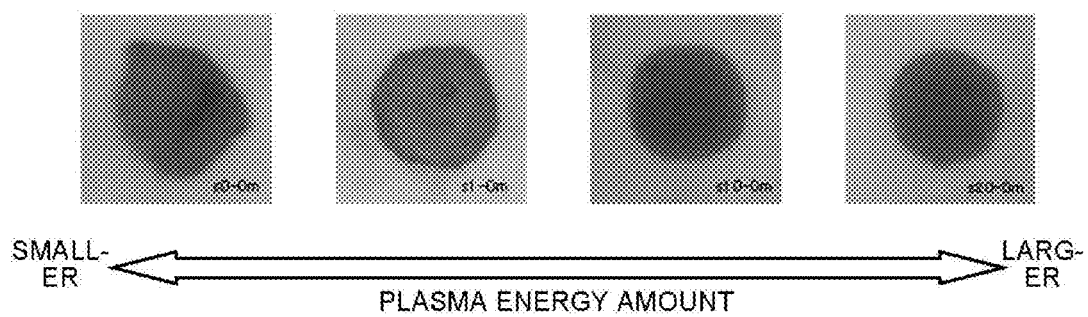
FIG. 13 is a schematic diagram illustrating a result on uniformity of pigment aggregation observed from ink droplets landed while a plasma energy amount is changed.

FIG. 13 illustrates a result on uniformity of the pigment aggregation observed from ink droplets landed while the plasma energy amount is changed. As illustrated in FIG. 13, the circularity of the dot formed on the medium increases with a larger plasma energy amount applied to the medium. The acidity of the surface of the medium increases with a larger plasma energy amount applied to the medium, thereby increasing the rate of aggregation of pigments. As a result, the uniformity of the pigment aggregation is improved. In the multipath printing, performing the plasma processing causes the rate of aggregation of pigments to be increased and the pigments to be spread uniformly and thinly on the respective bands, thereby making it possible to prevent the occurrence of the banding and to form high quality images.

The processing effect of the first plasma processing performed on a predetermined area of the medium and the processing effects of the second and subsequent plasma processing performed on the area of the medium differ in some cases due to the physical properties of the medium and the ink. In the embodiment, an appropriate plasma energy amount in relation to the medium and ink ejection amounts may be preliminarily specified and the most efficient amounts of plasma energy may be applied to the respective discharge electrodes in accordance with respective printing patterns so as to perform efficient plasma processing.

For example, after an image is formed on the medium (processing object) 20, moisture contained in the ink remains on the medium 20. When the plasma processing is performed in this condition, active species are formed in a larger amount than those formed by the plasma processing performed on the medium 20 in a dried condition with the same plasma energy amount. In the embodiment, the plasma energy amount of the plasma processing performed after an image is formed, that is, the second and subsequent plasma processing, is set to a smaller plasma energy amount than the plasma energy amount of the first plasma processing performed on the same area.

TABLE 1

| | Amounts of plasma energy applied to respective discharge electrodes [J/cm$^2$] | | | |
|---|---|---|---|---|
| | First discharge electrode | Second discharge electrode | Third discharge electrode | Fourth discharge electrode |
| First scan | 3 | 0 | 0 | 0 |
| Second scan | 3 | 1 | 0 | 0 |
| Third scan | 3 | 1 | 1 | 0 |
| Fourth scan | 3 | 1 | 1 | 1 |
| Fifth scan | 3 | 1 | 1 | 1 |
| ... | ... | ... | ... | ... |

Table 1 illustrates the amounts of plasma energy applied to the respective discharge electrodes for each scan. In Table 1, a first discharge electrode corresponds to the discharge electrode 101a and/or 101w in FIG. 3, a second discharge electrode corresponds to the discharge electrode 101b and/or 101x in FIG. 3, a third discharge electrode corresponds to the discharge electrode 101c and/or 101y in FIG. 3, and a fourth discharge electrode corresponds to the discharge electrode 101d and/or 101z in FIG. 3, for example.

As illustrated in Table 1, in the first scan, that is, the initial scan, only the first discharge electrode located on the most upstream side in the sub-scanning direction is driven. Thereafter, the number of discharge electrodes to be driven is increased one by one from the upstream side until the fourth scan. From the fourth scan to the (N−3)th scan, all of four discharge electrodes are driven. From the (N−2)th scan to the Nth scan, the number of discharge electrodes to be driven is reduced one by one from the downstream side. As a result, only the first discharge electrode is driven in the Nth scan.

The first discharge electrode performs the first plasma processing on the medium in all of the scans. In Table 1, the plasma energy amount applied to the first discharge electrode is set to a larger value than the amounts of plasma energy applied to the other discharge electrodes. In Table 1, the second discharge electrode performs the second plasma processing in all of the scans, the third discharge electrode performs the third plasma processing in all of the scans, and the fourth discharge electrode performs the fourth plasma processing in all of the scans. In Table 1, thus, the amounts of plasma energy applied to the second to the fourth discharge electrodes are the same value that is smaller than that of plasma energy applied to the first discharge electrode. The setting of the value is not limited to the example. The amounts of plasma energy applied to the second to the fourth electrodes may be set such that the amounts are reduced step by step from the second to the fourth electrodes, for example.

The following describes the plasma energy amount applied to the medium and the resulting processing effect in detail with reference to the accompanying drawings.

The processing effect described below is based on the following conditions. The type or the physical property of the medium is preliminarily specified. The plasma processing is performed with an appropriate plasma energy amount preliminarily obtained for each band. The plasma energy amount can be adjusted to an appropriate value in relation to the band width for each scan. This appropriate value can be set by adjusting the applied voltage and the frequency, for example. Basically, the processing effect was examined by changing the plasma energy in a range from 0.1 to 10.0 J/cm$^2$.

As for a means to find an optimum condition of the plasma energy amount applied to the medium, a method was employed in which the plasma energy amount applied to the medium was continuously changed for each medium, and images formed by performing inkjet recording on the media are compared with one another. As the items for evaluating the images, a print density, a dot diameter, the circularity, and granularity were measured besides a visual evaluation. As other evaluation items, the occurrence of the banding and a fixing property were measured. Those evaluation items depend on inks and the setting conditions of the inkjet recording. The pH value of the medium after the processing and a contact angle made between the medium and pure water after the processing were, thus, measured supplementarily as basic characteristics.

On the basis of the measurement results, the optimum condition was obtained for each medium and ink. The optimum conditions thus obtained (e.g., the optimum plasma energy amount) are used for controlling the inkjet recording device. In actual products, such control may be performed as follows: print quality is detected by a print quality detection unit (not illustrated) after printing, the plasma energy amount in the plasma processing is checked, printing is performed by inkjet recording, and then the medium after printing is taken out.

As for the control closer to that of the product, the following procedures may be employed. The surface of the medium is measured by, for example, a pH meter for solid samples after the plasma processing. Thereafter, the plasma energy amount (e.g., an applying voltage and a frequency) is changed on the basis of the measurement result. Other than the pH measurement, a contact angle measurement or the like can also be used as the means for checking the result of the plasma processing. For the contact angle measurement, a wetting reagent can be used, for example. When the plasma processing is inadequate, the wetting reagent is repelled and formed in a dome shape. By using a wetting reagent, whether the plasma processing is performed can be easily checked. The check of the plasma processing result using a wetting reagent may be performed periodically but regularly.

Examples of the means to check wettability include a method in which the height of a wetting reagent adhering on the medium is optically measured and another method in which a difference in density of color of a wetting reagent is optically measured. Examples of a method for measuring an application quantity include a measurement of glossiness of the dots formed on the medium and an absorbance measurement method in which a specific absorption wavelength of a substance contained in a wetting reagent is measured.

The processing conditions of the plasma processing can be set to the optimum conditions in accordance with media and inks by periodically performing the optimizing control described above. The optimizing control may, however, be ineffective when an unintended medium is used, for example. In such a case, the medium may be processed again on the basis of the checking result of the plasma processing. The storing of information such as the measurement results, the plasma energy amount used, the medium, and the ink used in such cases makes it possible to perform learning control using the stored information in the next processing onwards.

The optimizing control is based on the medium and the ink used. In terms of optimizing images, it is more preferable that the optimizing control is based on the actual print result. The following describes an example of such optimizing control. The inkjet recording device provided with a built-in reflection densitometer prints a reference test pattern on a medium by inkjet recording while continuously changing the plasma energy amount applied to the medium, and thereafter the print density of the formed test pattern is measured by the reflection densitometer. The processing condition by which the highest print density is obtained is set as the optimum condition. The inkjet recording is performed in the next operation onwards while maintaining the optimum condition by the optimizing control. This control can change the measurement and the processing conditions in a short time, thereby making it possible to perform prompt inkjet recording. The storing of density information from the reflection densitometer makes it possible to perform learning control using the stored information in the next operation onwards.

The optimum condition, however, is changed by the compositions and types of inks, and types of media. High quality printed materials can be stably output by storing the composition and type of ink used, the type of medium, and the conditions and results when they are used, and changing conditions as appropriate on the basis of the stored information. This method can change the conditions between the medium having a high permeability and the medium having a low permeability, for example, thereby making it possible to stably output high quality printed materials.

Furthermore, combined processing can also be performed in which the electrical resistance of the medium is measured and the thickness and characteristics of the medium are specified to some extent before the plasma processing is performed, and the optimization is performed after the examination described above.

It is generally known that when the surface of the medium has a high wettability, the wettability of the surface of the medium is further increased with an increase in surface roughness of the medium, while when the surface of the medium has a low wettability, the wettability of the surface of the medium is further decreased with an increase in surface roughness of the medium. The wettability (hydrophilicity) and asperities (surface roughness) of the surface of the medium are, thus, controlled using the plasma processing. In other words, the aggregation and the permeability of pigments in ink are controlled using the plasma processing. This control makes it possible to increase the circularity of ink dots (simply described as the dots in some cases) and to prevent the dots from being gathered to one another, thereby expanding the sharpness and the color gamut of the dots. As a result, not only the banding but also the image defects such as beading and bleeding are eliminated, thereby making it possible to produce printed materials on which high quality images are formed. In addition, an ink droplet amount can be reduced by uniformly thinning the thickness of the pigments aggregated on the medium, thereby making it possible to reduce energy for drying ink and a printing cost.

Figure 14:
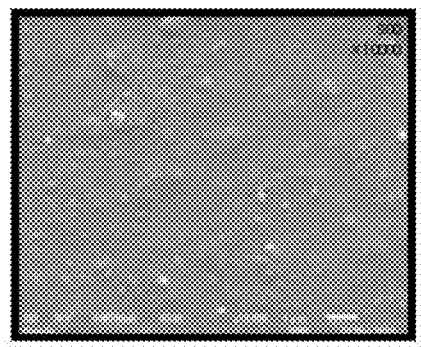
FIG. 14 is an image illustrating a surface of a white vinyl chloride sheet on which no plasma processing was performed (plasma energy=0 J/cm2) in the embodiment.
Figure 15:
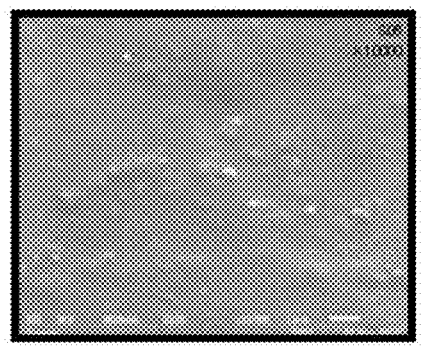
FIG. 15 is an image illustrating the surface of the white vinyl chloride sheet on which the plasma processing was performed (plasma energy=2.0 J/cm2) in the embodiment.
Figure 16:
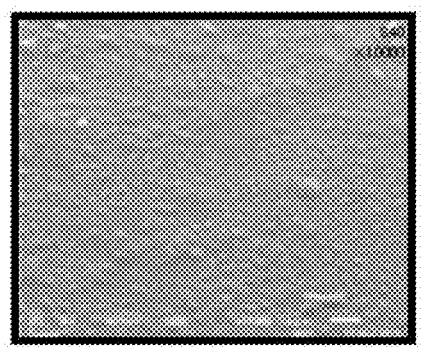
FIG. 16 is an image illustrating the surface of the white vinyl chloride sheet on which the plasma processing was performed (plasma energy=5.6 J/cm2) in the embodiment.

The following describes a relation between the plasma processing according to the embodiment and the surface roughness of the medium with reference to the accompanying drawings. FIGS. 14 to 16 illustrate scanning electron microscope (SEM) photographs of a white vinyl chloride sheet having been subject to the plasma processing. FIG. 14 illustrates the surface of the white vinyl chloride sheet on which no plasma processing was performed (with the plasma energy=0 J/cm$^2$). FIG. 15 illustrates the surface of the white vinyl chloride sheet on which the plasma processing was performed with the plasma energy=2.0 J/cm$^2$. FIG.

Figure 17:
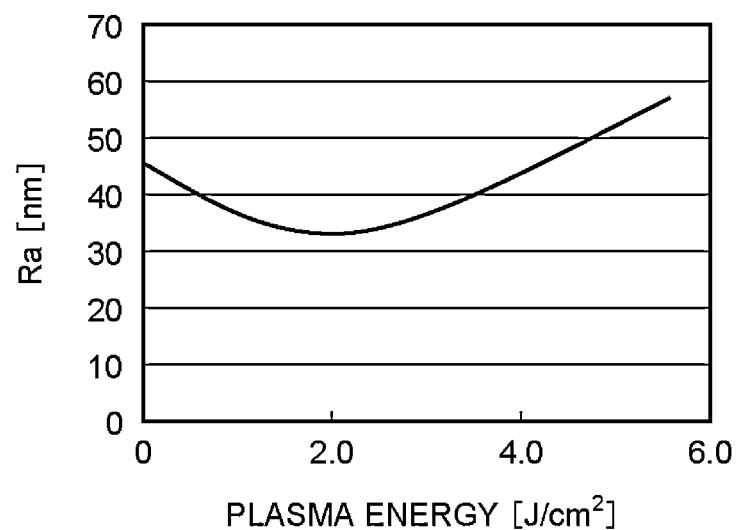
FIG. 17 is a graph illustrating a relation between the plasma energy amount according to the embodiment and a surface roughness Ra.

16 illustrates the surface of the white vinyl chloride sheet on which the plasma processing was performed with the plasma energy=5.6 J/cm². FIG. 17 illustrates a relation between the plasma energy and a surface roughness Ra.

As illustrated in FIGS. 14 to 16, and 17, with an increase in the plasma energy, the surface roughness Ra of the processed surface is decreased when the plasma energy is in an range substantially from 0 J/cm² (no plasma processing is performed) to 2.0 J/cm². This reduction is because relatively large asperities are eliminated from the processed surface (i.e., the surface of the medium). When the plasma energy is in a range beyond substantially 2.0 J/cm², with an increase in the plasma energy, the surface roughness Ra of the processed surface is increased. This increase is because relatively small asperities are formed on the processed surface, which make the surface rough. When the plasma energy is in a range beyond substantially 2.0 J/cm², the surface roughness Ra of the processed surface is greater (rougher) than that when the plasma energy is 0 J/cm² (no plasma processing is performed).

The following describes effects of the plasma processing performed on a non-permeable medium on the basis of actual experiment results. A white vinyl chloride sheet was used as the non-permeable medium. A part of the experiment results was obtained using tarpaulin. Tarpaulin is a sheet composed of polyester fibers and a synthetic resin sandwiching the polyester fibers.

In the following description, the white vinyl chloride sheet was used as the non-permeable medium. The same effect of increasing wettability by the plasma processing is also obtained when the plasma processing is performed on a non-permeable medium made of a thermoplastic resin such as polyester or acrylic.

The following describes the experiment results when the white vinyl chloride sheet was used as the medium. In the experiment, a shuttle inkjet recording device was used. The shuttle inkjet recording device, in which the inkjet head is shuttled, is used for printing on a wide medium such as wall paper or a poster. In the embodiment, the plasma processing and the inkjet recording were performed separately. In processing of actual products, the plasma processing device may be provided upstream of the inkjet head and the plasma processing and the inkjet recording may be performed in a continuous processing flow using a medium transfer. Alternatively, as illustrated in FIG. 3, the plasma processing device and the inkjet head may be integrated with each other.

In the experiment, an aqueous pigment ink was used. The aqueous pigment ink was prepared by mixing about 3 wt % of colorants, about 50 wt % of ether solvent and diol solvent, a small amount of a surface active agent, and about 5 wt % of a styrene-acrylic resin having a particle diameter of 100 to 300 nm to disperse pigments, and prepared to have a surface tension of 21 to 24 N/m and a viscosity of 8 to 11 MPa·s.

Other preferable examples other than the styrene-acrylic resin used in the experiment are hydrophobic resins such as an acrylic resin, a vinyl acetate resin, a styrene-butadiene resin, a vinyl chloride resin, a butadiene resin, and a styrene resin. The resins exemplified above preferably have relatively low molecular weight and are formed in emulsion.

For the purpose of further effectively preventing nozzle clogging, it is preferable to add glycols to the ink. Examples of glycols include ethylene glycol, diethylene glycol, triethylene glycol, propylene glycol, dipropylene glycol, tripropylene glycol, polyethylene glycol having a molecular weight of 600 or smaller, 1,3-propylene glycol, isopropylene glycol, isobutylene glycol, 1,4-butandiol, 1,3-butandiol, 1,5-pentanediol, 1,6-hexanediol, glycerine, meso-erythritol, and pentaerythritol. Furthermore, examples of glycols include other thiodiglycol, 1,4-butanediol, 1,5-pentanediol, 1,6-hexanediol, propylene glycol, dipropylene glycol, tripropylene glycol, neopentyl glycol, 2-methyl-2,4-pentanediol, trimethylolpropane, trimethylolethane, and mixtures thereof.

Preferable examples of an organic solvent include alkyl alcohols having a carbon number from 1 to 4 such as ethanol, methanol, butanol, propanol, and isopropanol (2-propanol), glycol ether such as ethylene glycol monomethyl ether, ethylene glycol monoethyl ether, ethylene glycol monobutyl ether, ethylene glycol monomethyl ether acetate, diethylene glycol monomethyl ether, diethylene glycol monoethyl ether, diethylene glycol mono-n-propyl ether, ethylene glycol mono-iso-propyl ether, diethylene glycol mono-iso-propyl ether, ethylene glycol mono-n-butyl ether, ethylene glycol mono-t-butyl ether, diethylene glycol mono-t-butyl ether, 1-metyl-1-methoxybutanol, propylene glycol monomethyl ether, propylene glycol monoethyl ether, propylene glycol mono-t-butyl ether, propylene glycol mono-n-propyl ether, propylene glycol mono-iso-propyl ether, dipropylene glycol monomethyl ether, dipropylene glycol monoethyl ether, dipropylene glycol mono-n-propyl ether, and dipropylene glycol mono-iso-propyl ether, formamide, acetamide, dimethyl sulfoxide, sorbit, sorbitan, acetin, diacetin, triacetin, sulfolane, pyrrolidone, and N-methyl pyrrolidone.

For further simulating ink actually used for products, a preservative, a fungicide, a pH conditioner, a dye dissolution aid, an antioxidant, a conductivity conditioner, a surface tension conditioner, and an oxygen absorber may be added, for example. As described above, the acidic groups formed on the surface of the medium by the plasma processing cause the rate of aggregation of pigments to be increased. The rate of aggregation of pigments is increased even when the ink after being applied is irradiated with plasma, due to the reaction of a resin (polymer) contained in the ink, for example, siloxane or polyether, with plasma. The effect depends on the compositions of inks. The ink used and evaluated in the experiment was capable of forming the optimum image with about half of the plasma energy amount applied before the ink was applied.

The inkjet recording device used in the experiment is provided with heat-drying devices. When printing is performed on a non-permeable medium, a heat-drying device is required because an aqueous pigment ink does not have a high volatile property that a solvent-based ink has. In addition, the non-permeable medium has no ability of fixing the colorants of the ink on the surface thereof (when plain paper is used, the colorants are permeated into fibers and fixed therein). To fix the colorants to the medium in being dried, it is necessary to add a synthetic resin to the ink so as to thermally fuse and bond the colorants. The heat-drying devices are provided to the following three locations: a preheating heater used before recording, a heater for printing disposed under the inkjet head, and a post-printing heater used after recording. Table 2 illustrates the use conditions of the respective heaters as the experiment conditions.

TABLE 2

|  | Preheating heater | Heater for printing | Post-printing heater |
|---|---|---|---|
| Ref. | >50° C. | >50° C. | >50° C. |
| 0 J/cm² | OFF | OFF | >50° C. |
| 5.6 J/cm² | OFF | OFF | >50° C. |

In Table 2, the tested white vinyl chloride sheet is denoted as "Ref." because the printing is normally performed using the three heaters each heated at 50° C. or more. The printing for the white vinyl chloride sheet after the plasma processing was performed using only the post-printing heater. The plasma energy used for the plasma processing was 5.6 J/cm². The white vinyl chloride sheet on which no plasma processing had been performed (the plasma energy used for the plasma processing was 0 J/cm²) and for which only the post-printing heater had been used was also measured as a comparative object.

Figure 18:
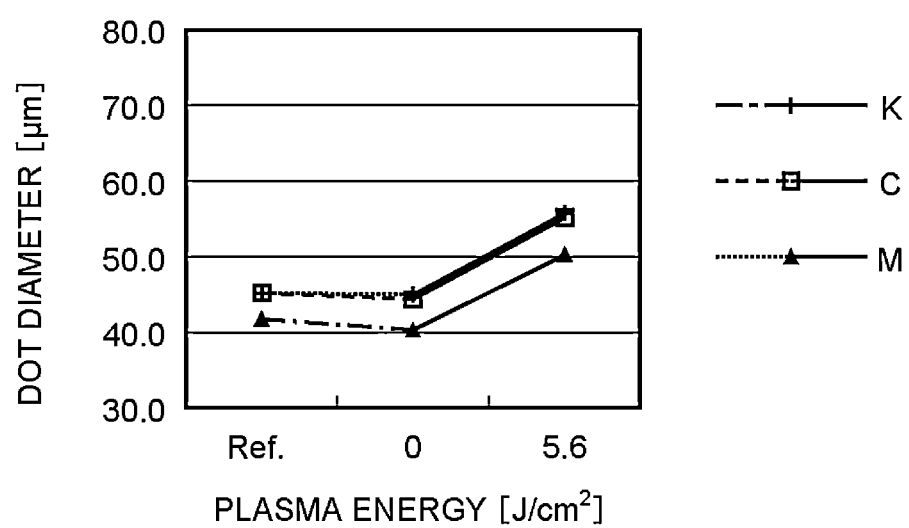
FIG. 18 is a graph illustrating diameters of dots formed after ink droplets having the same diameter according to the embodiment were dropped on a surface of a white vinyl chloride sheet, which is a non-permeable medium.

FIG. 18 is a graph illustrating diameters of dots formed after ink droplets having the same diameter were dropped on the surface of the white vinyl chloride sheet, which is a non-permeable medium. FIG. 19 is a graph illustrating diameters of dots formed after ink droplets having the same diameter were dropped on the surface of the tarpaulin, which is a non-permeable medium. As illustrated in FIGS. 18 and 19, when the plasma processing (5.6 J/cm²) was performed, the diameters of the dots were larger by 1.2 to 1.3 times than those in the case where no plasma processing was performed (Ref.) and in the case where the number of heaters used was reduced without performing the plasma processing (0 J/cm²). This result means that, when the plasma processing (5.6 J/cm²) was performed, the ink landed on the surface of the medium was capable of being promptly dried, as described above.

FIG. 20 is the images of the ink dots actually formed on the surface of the non-permeable medium (white vinyl chloride sheet) when ink droplets having the same size were dropped on the medium. In FIG. 20, the ink dots of black ink are illustrated on the left side while the ink dots of cyan ink are illustrated on the right side. As illustrated in FIG. 20, the four dots were formed under each condition. As illustrated in FIG. 20, when the plasma processing (5.6 J/cm²) was performed, the diameters of the dots were larger than those in the case where no plasma processing was performed (Ref.) and in the case where the number of heaters used was reduced without performing the plasma processing (0 J/cm²). In addition, when the plasma processing (5.6 J/cm²) was performed, the circularity of the dots was more improved than those in the case where no plasma processing was performed (Ref.) and in the case where the number of heaters used was reduced without performing the plasma processing (0 J/cm²).

Figure 21:
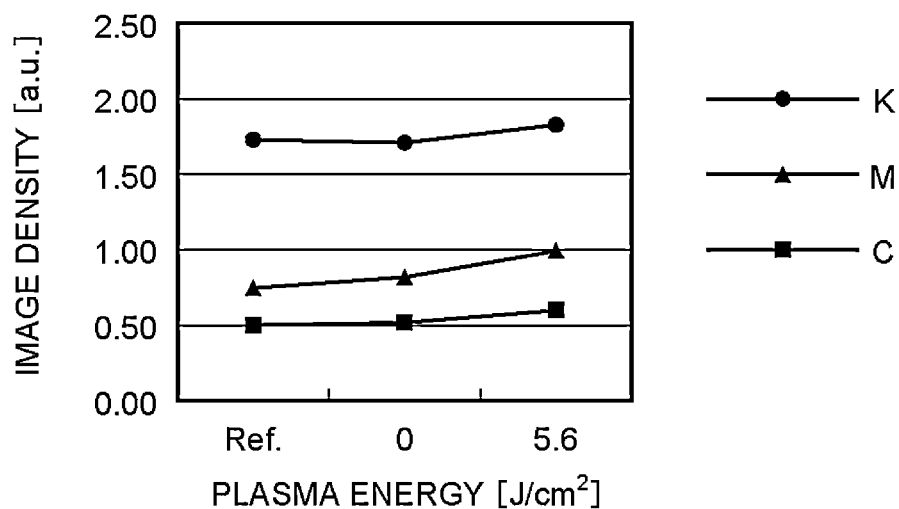
FIG. 21 is a graph illustrating image densities obtained when solid printing was performed on the white vinyl chloride sheet, which is the non-permeable medium according to the embodiment, under respective conditions.
Figure 22:
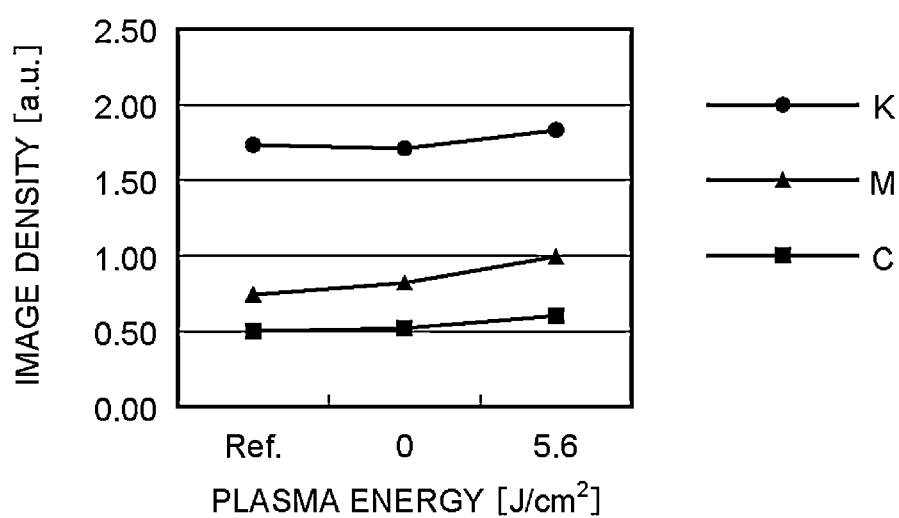
FIG. 22 is a graph illustrating image densities obtained when solid printing was performed on the tarpaulin, which is the non-permeable medium according to the embodiment, under the respective conditions.

FIG. 21 is a graph illustrating image densities obtained when solid printing was performed on the white vinyl chloride sheet, which is a non-permeable medium, under the respective conditions. FIG. 22 is a graph illustrating image densities obtained when solid printing was performed on the tarpaulin, which is a non-permeable medium, under the respective conditions. As illustrated in FIGS. 21 and 22, when the plasma processing (5.6 J/cm²) was performed, the image densities were greater than those in the case where no plasma processing was performed (Ref.) and in the case where the number of heaters used was reduced without performing the plasma processing (0 J/cm²). This result means that the plasma processing makes it possible to achieve the same density as that in the case where no plasma processing is performed even if the ink droplet amount is reduced.

When a synthetic resin is added to ink for example, the synthetic resin in the ink can be transiently melted by heating the medium on which an image is formed using the post-printing heater as described above, thereby making it possible for the image formed on the surface of the medium to closely adhere on the medium. As a result, the formed image is hardly peeled from the medium and the fixing property of the formed image can also be improved.

According to the present embodiment, the printing apparatus, the printing system, the computer program product, and the method for manufacturing a printed material that can prevent the occurrence of the banding in the multipath printing and manufacture high quality printed materials.

Although the invention has been described with respect to specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A printing apparatus comprising:
a plasma processing unit that performs plasma processing on a predetermined area on a target recording medium at least two times;
a control unit that sets a plasma energy amount used by the plasma processing unit to perform a first plasma processing on the predetermined area of the target recording medium as a first energy amount and sets a plasma energy amount used by the plasma processing unit to perform a second plasma processing on the predetermined area as a second energy amount smaller than the first energy amount; and
a recording unit that includes an inkjet head that performs inkjet recording on the predetermined area while reciprocating in a scanning direction perpendicular to a conveying direction of the target recording medium;
wherein the plasma processing unit includes a first electrode that is supplied with the first energy amount while the recording unit moves in a first scan; and
wherein the plasma processing unit includes a second electrode that is adjacent to the first electrode in the conveying direction and that is supplied with the second energy amount while the recording unit moves in a second scan that is subsequent to the first scan.

2. The printing apparatus according to claim 1, wherein the plasma processing unit acidifies a surface of the target recording medium.

3. The printing apparatus according to claim 1, wherein the plasma processing unit causes atmospheric non-equilibrium plasma to come into contact with the target recording medium.

4. The printing apparatus according to claim 1, wherein the plasma processing unit increases permeability of at least a surface of the target recording medium.

5. The printing apparatus according to claim 1, wherein the first electrode and the second electrode are disposed close to the inkjet head in the scanning direction.

6. The printing apparatus according to claim 1, wherein the inkjet head includes a plurality of inkjet heads arranged in the conveying direction of the target recording medium.

7. The printing apparatus according to claim 1, wherein the control unit adjusts the plasma energy amount of the plasma processing unit on the basis of at least one of a type of the target recording medium and a printing mode.

8. The printing apparatus according to claim 1, wherein the control unit adjusts the plasma energy amount of the plasma processing unit in accordance with an ink used by the recording unit.

9. The printing apparatus according to claim 1, wherein the control unit adjusts the plasma energy amount of the plasma processing unit in accordance with a size of an ink droplet ejected by the recording unit.

10. The printing apparatus according to claim 1, wherein an ink applied by the recording unit to a surface of the target recording medium includes pigments that are charged negatively and dispersed in a liquid.

11. The printing apparatus according to claim 1, wherein an ink applied by the recording unit to a surface of the target recording medium is an aqueous pigment ink.

12. The printing apparatus according to claim 1, wherein the target recording medium has an organic polymer on a surface of the target recording medium and is a non-permeable medium or a slow-permeable medium with respect to water.

13. The printing apparatus according to claim 1, wherein the target recording medium is coat paper having a coat layer on a surface of the coat paper.

14. The printing apparatus according to claim 1, wherein the plasma processing unit acidifies at least a surface of the target recording medium to have acidity that causes a viscosity of an ink applied by the recording unit to the surface of the target recording medium to be equal to or greater than a predetermined value.

15. The printing apparatus according to claim 1, wherein the plasma processing unit increases a hydrogen ion density of at least a surface of the target recording medium in accordance with a characteristic of an ink applied by the recording medium to the surface of the target recording medium.

16. A computer program product comprising a non-transitory computer readable medium that stores a program that operates a computer mounted on a printing apparatus including a plasma processing unit performing plasma processing on a predetermined area of a target recording medium at least two times and a recording unit performing inkjet recording on the predetermined area on which the plasma processing unit has performed the plasma processing, and causes the computer to execute:

setting a plasma energy amount used by the plasma processing unit to perform a first plasma processing on the predetermined area of the target recording medium as a first energy amount; and setting, as a second energy amount smaller than the first energy amount, a plasma energy amount used by the plasma processing unit to perform a second plasma processing on the predetermined area after the recording unit performs the inkjet recording on the predetermined area wherein the plasma processing unit includes a first electrode that is supplied with the first energy amount while the recording unit moves in a first scan; and wherein the plasma processing unit includes a second electrode that is adjacent to the first electrode in a conveying direction of the target recording medium and that is supplied with the second energy amount while the recording unit moves in a second scan that is subsequent to the first scan.

17. A method for manufacturing a printed material on which an image is formed by an inkjet recording technique on a target recording medium, the method comprising:

performing plasma processing with a plasma processing unit on a predetermined area of the target recording medium with a first plasma energy amount;

performing inkjet recording with a recording unit on the predetermined area on which the plasma processing has been performed with the first plasma energy amount; and performing the plasma processing on the predetermined area with a second plasma energy amount smaller than the first plasma energy amount when a second plasma processing is performed on the predetermined area on which the inkjet recording has been performed, wherein the plasma processing unit includes a first electrode that is supplied with the first energy amount while the recording unit moves in a first scan; and wherein the plasma processing unit includes a second electrode that is adjacent to the first electrode in a conveying direction of the target recording medium and that is supplied with the second energy amount while the recording unit moves in a second scan that is subsequent to the first scan.

* * * * *